United States Patent [19]
Almasi et al.

[11] 4,128,895
[45] Dec. 5, 1978

[54] MAGNETIC WALL ASSISTED BUBBLE DOMAIN NUCLEATOR

[75] Inventors: George S. Almasi, Katonah; George E. Keefe, Montrose; Yeong S. Lin, Mt. Kisco, all of N.Y.

[73] Assignee: International Business Machines Corporation, Armonk, N.Y.

[21] Appl. No.: 801,963

[22] Filed: May 31, 1977

[51] Int. Cl.² ............................................. G11C 19/08
[52] U.S. Cl. ...................................... 365/11; 365/36; 365/39; 365/41
[58] Field of Search ................... 340/174 TF; 365/11, 365/36, 39, 41

[56] References Cited
U.S. PATENT DOCUMENTS 3,824,571 7/1974 Clover, Jr. et al. ........... 340/174 TF
4,070,658 1/1978 Giess et al. ............................. 365/36

Primary Examiner—James W. Moffitt
Attorney, Agent, or Firm—Jackson E. Stanland

[57] ABSTRACT

An improved magnetic bubble domain nucleator is provided which uses a magnetic wall, such as a charged wall, Neel wall, or Bloch wall, to assist nucleation. In a preferred embodiment, a magnetic charged wall is produced in an ion implanted region of a magnetic material with an in-plane magnetic field, and an applied nucleating magnetic field is produced by current in a conductor. The combination of the first magnetic field associated with the charged wall and the second magnetic field produced by current through the conductor is sufficient to nucleate a bubble domain in the magnetic medium whereas each of these fields acting alone is not sufficient for nucleation. Since the first magnetic field provides a component of the total nucleating field, the amount of nucleation current required in the conductor is reduced. Any structure that can be used to provide the magnetic charged wall, including ion implanted regions of a magnetic material, or an apertured layer of magnetically soft material is suitable in the practice of this invention. The structure for providing the second magnetic field is conveniently provided by a current carrying conductor, or by a magnetic element having a stray field associated therewith, or even by another magnetic bubble domain. Thus, this invention seeks to use naturally occurring magnetic walls to assist bubble nucleation rather than using additional structure.

23 Claims, 12 Drawing Figures

MAGNETIC WALL ASSISTED BUBBLE DOMAIN NUCLEATOR

BACKGROUND OF THE INVENTION

1. Field of the Invention

This invention relates to magnetic bubble domain nucleators, and more particularly to improved nucleators using magnetic walls to assist the nucleation operation. The resulting technique is especially advantageous for use with contiguous elements for propagating magnetic bubble domains, such as the contiguous disk elements typically formed by ion implantation of a magnetic medium.

2. Description of the Prior Art

In the magnetic bubble domain art, bubble domain generators are often employed for producing information bubble domains. Two techniques exist for doing this. In one device, termed a replicator, a seed domain is split to provide new bubble domains. Replicators generally comprise a magnetically soft disk around which the seed domain travels in response to the reorientation of a magnetic field in the plane of the disk. These disk generators operate reliably at quasi-static frequencies but have disadvantages of initialization (i.e., stabilization of the seed bubble) and low phase margin problems at high frequency operation. That is, at high frequencies the control conductor used to assist splitting must be energized at an appropriate time within the cycle of the rotating drive field to reliably replicate the seed bubble domain.

Another type of bubble domain generator is the nucleator, which reverses the direction of magnetization in a localized region of a magnetic bubble domain material. Such a generator does not rely on splitting a seed domain. One example of a typical nucleator is simply a hair-pin conductor loop which when energized with an adequate current pulse nucleates the bubble domain within the loop. Typical current levels required for nucleation of 5 micron bubble domains in a garnet bubble domain material are 400–500 mA. Another example of a magnetic bubble domain nucleator is one where the nucleation field is provided by the stray magnetic field associated with a magnetic element. Examples of both such nucleators are provided in U.S. Pat. No. 3,662,359.

The principles of U.S. Pat. No. 3,662,359 have been utilized in the nucleator of U.S. Pat. No. 3,824,571, which shows the combination of a current carrying line and a magnetically soft element for nucleation of bubbles. The presence of the magnetically soft element provides a magnetic field which aids nucleation, so that the entire nucleation field does not have to be produced by current in the conductor.

In the present invention, a magnetic wall, such as a charged wall, is used to assist nucleation and in fact provides a large percentage of the total nucleation field. The use of a magnetic charged wall means that additional magnetic elements do not have to be provided for part of the nucleator, as is the situation in U.S. Pat. No. 3,824,571. This aids in fabrication, particularly if the additional magnetic elements are discrete elements having small linewidths as is shown in U.S. Pat. No. 3,824,571. Additionally, discrete magnetic elements may not be desirable for certain types of bubble storage devices. In particular, the nucleator of U.S. Pat. No. 3,824,571 is not suitable for use in a bubble storage device utilizing contiguous propagation elements. In such a contiguous element device, ion implanted regions of a magnetic material or continuous sheets of magnetically soft material provide magnetic charged walls which reorient in a plane parallel to the bubble medium. These magnetic charged walls are used for bubble functions, such as propagation. The discrete element structure of U.S. Pat. No. 3,824,571 will not provide these magnetic charged walls and the provision of additional magnetic elements for nucleation would defeat many of the advantages achieved when magnetic charged walls are used in contiguous element bubble devices.

For these contiguous-disk devices, the minimum overlay feature is typically restricted to be no less than about four times the bubble diameter. If a hair-pin conductor nucleator is used with such a contiguous disk device and has that restriction in terms of the minimum overlay feature, this type of nucleator becomes less efficient due to the wide spread of magnetic field produced by the wide nucleating conductor. Additionally, as the bubble size scales downward, the effective anisotropy field ($H_K - 4\pi M$), which dictates the minimum current required for nucleation of bubbles, generally scales upward.

The present invention attempts to provide improved bubble domain nucleators, and in particular nucleators which are suitable for use in contiguous propagation element bubble devices utilizing magnetic charged walls.

Accordingly, it is a primary object of the present invention to provide improved magnetic bubble domain nucleation requiring small amounts of nucleating current.

It is another object of the present invention to provide an improved magnetic bubble domain nucleator which is particularly suited for use with bubble devices using contiguous propagation elements.

It is still another object of the present invention to provide an improved bubble domain nucleator which can be used with bubble propagation elements using magnetic charged walls for movement of bubble domains.

It is a further object of the present invention to provide an improved magnetic bubble domain nucleator which can be used with bubble devices designed for storage of very small bubble domains.

It is a still further object of the present invention to provide a bubble domain nucleator of high efficiency, which can be used with bubble devices designed for use with bubble domains of one micron and less in diameter.

It is another object of the present invention to provide a magnetic bubble domain nucleator for use with bubble domain devices having minimum overlay features no less than about four times the bubble diameter.

BRIEF SUMMARY OF THE INVENTION

Enhanced magnetic bubble domain nucleation is achieved by using a nucleation field which is at least partially provided by a magnetic wall such as a charged wall, Neel wall, or a Bloch wall. The total magnetic field for nucleation of bubbles is the combination of the magnetic field due to the wall and at least one other magnetic field. This means that the increment of nucleation field which has to be provided by means other than the magnetic wall, such as that provided by a current carrying conductor, is reduced from what it would have to be if that incremental field were entirely responsible for bubble nucleation.

In a preferred embodiment, a current carrying conductor produces a magnetic field which is combined with the magnetic field produced by a magnetic charged wall in order to provide a total nucleation field sufficient for producing a bubble domain in a magnetic medium. Since the current carrying conductor does not have to provide the total nucleation field, current through the conductor can be kept sufficiently low that problems such as heat dissipation and electromigration are largely avoided.

A main advantage of the present invention is that it can be particularly adapted for use with contiguous propagation element bubble devices, such as the well known contiguous disk devices. In such devices, the minimum overlay feature of the device should be no less than about four times the bubble diameter. The present invention allows a current carrying conductor of this dimension to be used even though this wide conductor is less efficient than a narrow conductor for producing an intense magnetic field.

Further, the present nucleator can be used to provide very small magnetic bubble domains, even though the effective anisotropy field for bubble nucleation increases as the size of the bubble decreases.

In examples to be described, the current carrying conductor in the present nucleator provides about one-third of the nucleation field, while the remaining two-thirds of the nucleation field is provided by a magnetic charged wall. Depending upon the size of the bubble to be nucleated, the magnetic properties of the bubble medium, the geometry and layout of the conductor, etc., there is a wide range of bubble nucleation currents and current pulse widths which can be successfully used.

Typically, a magnetic charged wall is provided by ion implanted regions in a magnetic material, or by an apertured layer of magnetically soft material of appropriate thickness, such as NiFe. As is well known, when a magnetic field is applied in the plane of the apertured layer or in the plane of the ion implanted regions, magnetic charged walls will be established in these materials. These charged walls produce magnetic fields having components directed anti-parallel to the magnetization of the bubble domain material. If the field produced by current in an overlying conductor is combined with the magnetic field produced by the charged wall, the nucleation threshold of the bubble material can be overcome to reverse the direction of magnetization of the bubble material, thereby nucleating a bubble domain. For bubble devices using an in-plane rotating magnetic field, a single bubble domain can be nucleated each cycle of rotation of that field.

These and other objects, features, and advantages of the present invention will be more apparent from the following detailed description.

BRIEF DESCRIPTION OF THE DRAWINGS

FIGS. 3A–6B show four different bubble nucleators which are compared to illustrate the advantages of the present invention. Results of this comparison are presented in Table 1 in the specification.

FIG. 3A is a top view of a bubble nucleator which operates without utilizing magnetic charged walls, while

FIG. 6B is a side view of the nucleator of FIG. 6A, taken along the line 6B—6B.

DETAILED DESCRIPTION OF THE PREFERRED EMBODIMENTS

All of the embodiments to be described hereinafter utilize a magnetic wall (charged wall) for provision of a portion of the nucleation field required to produce a bubble domain in a magnetic medium. The charged wall can be provided by using ion implanted regions of a magnetic medium, or by using a layer of a magnetic material of suitable thickness, such as NiFe, etc.

The nature of a magnetic charged wall, and its use to move magnetic bubble domains, is described by G. S. Almasi et al in a paper entitled "Bubble Domain Propagation Mechanisms in Ion Implanted Structures," which appeared in the AIP Conference Proceedings, No. 24, p. 630–632, 1975. This was the Conference Proceedings of the 20th Annual Conference on Magnetism and Magnetic Materials which was held in San Francisco, in 1974. Copending application Ser. No. 645,737 (filed Dec. 31, 1975) and now U.S. Pat. No. 4,070,658 describes the use of magnetic charged walls for movement of very small magnetic bubble domains, while copending application Ser. No. 755,897 (filed June 30, 1976) describes a novel bubble translation switch which utilizes magnetic charged walls. The inventions described in those copending applications are assigned to the present assignee also.

Current Assisted Bubble Nucleator (FIGS. 1A, 1B, 2A and 2B)

Figure 1A:
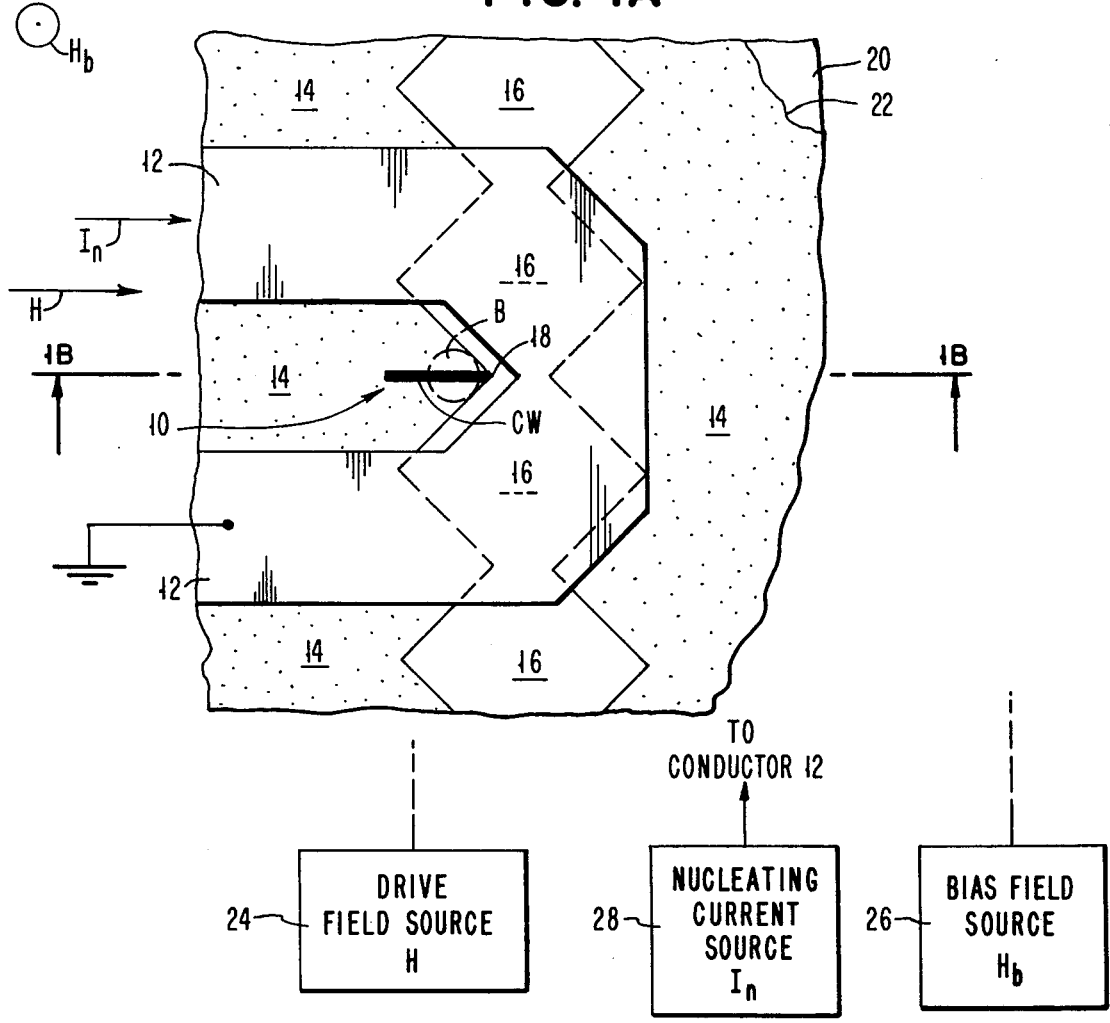
FIG. 1A is a top view of a magnetic bubble domain nucleator in accordance with the principles of the present invention.

These figures show two different embodiments of bubble domain nucleators which use current carrying conductors together with magnetic charged walls for nucleation of bubble domains. The charged walls are produced by the action of a magnetic field in ion implanted regions of a magnetic medium. In more detail, FIG. 1A is a top view of the nucleator 10, which is used to produce a bubble domain B at one end of a magnetic charged wall CW. Nucleator 10 is generally comprised of a current carrying conductor 12 and an ion implanted region 14. Region 14 is shown stippled to distinguish it from diamond-shaped regions 16, which are not ion implanted. Bubble B is nucleated in a cusp 18 using charged wall CW (of appropriate polarity) and the magnetic field produced by a nucleation current $I_n$ through conductor 12.

Assuming that a bubble domain B with negatively magnetized top surface is to be nucleated in the cusp 18, a converging charged wall provides a favorable flux linkage toward the underlying bubble. Additionally, a current $I_n$ in conductor 12 enhances the flux linkage in order to overcome the "nucleation threshold" of the bubble material. This threshold is related to the effective anisotropy field ($H_K - 4\pi M$) of the bubble layer. When the threshold is overcome by the combination of the magnetic field produced by current $I_n$ and the magnetic field of the magnetic charged wall, a bubble domain will be nucleated in cusp 18.

The structure of FIG. 1A uses, for example, a double garnet layer. Bottom layer 20 is the magnetic layer in which bubble domains are to be nucleated while overlying garnet layer 22 is a magnetic layer which can be ion implanted. Such double layer structures for movement of submicron bubble domains are shown in more detail in aforementioned copending application Ser. No. 645,737 (now U.S. Pat. No. 4,070,658).

Figure 1B:
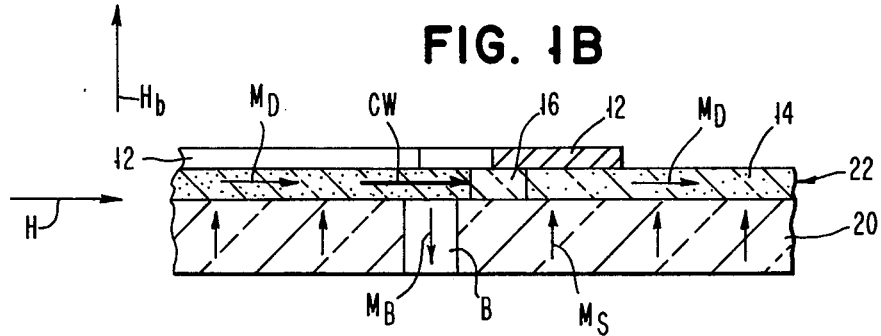
FIG. 1B is a side view of the nucleator of FIG. 1A, taken along the line 1B—1B.

FIG. 1B is a cross-sectional view of the structure of FIG. 1A. The magnetic bubble layer in which bubbles B are to be nucleated has magnetization $M_S$ pointed upward. The bubble domain B has a magnetization $M_B$ pointed downward. Stippled portions of layer 22 are ion implanted to provide regions having in-plane magnetization $M_D$, while portions 16 are protected by a mask during implantation and are therefore not ion implanted. Since layer 22 is used to produce ion implanted regions 14 for propagation of bubble domains, it is termed the drive layer, while layer 20 is the bubble storage layer.

As is well known in the art, magnetic bubble domains will move along the edges of the ion implanted regions 14 in response to the reorientation of a magnetic drive field H in the plane of layer 22. A drive field source 24, generally comprised of X and Y field coils, provides the drive field. The bubble domains B in layer 20 are stabilized by the bias field $H_b$ whose direction is anti-parallel to the magnetization $M_B$ of the bubble. Field $H_b$ is produced by source 26, which is also well known in the art.

Nucleation current $I_n$ in conductor 12 is provided by nucleating current source 28 and provides a magnetic field at cusp 18 which combines with the magnetic field of charged wall CW to produce a total nucleation field sufficient to nucleate a bubble B. This current is applied when magnetic field H is directed as shown in FIG. 1A. If drive field H is a constant rotating field, a current pulse $I_n$ will generally be produced once each cycle of H to nucleate a bubble domain. If the bubble device using these domains has information coded in terms of the presence and absence of bubble domains, a bubble domain B will be nucleated each cycle of the drive field if a "one bit" is desired, while such nucleation will not occur if a "zero bit" is desired.

As is apparent, this charged wall assisted nucleator is particularly designed for use in bubble devices which utilize magnetic charged walls for various functions, such as bubble propagation. Such charged walls are typically formed by the combination of the drive field H and contiguous propagation elements formed by ion implanted regions 14 in a magnetic material. However, charged walls can also be provided in a layer of magnetically soft material having apertures therein. As an example, layer 22 could be a layer of NiFe in which the regions 16 would be apertures, while the regions 14 would be continuous NiFe. The magnetic charged wall would be formed at the cusp 18 located at the boundary of the aperture 16 and the continuous NiFe 14.

The nucleator 10 is designed so that the magnetic field formed by current $I_n$ in conductor 12 combines with the magnetic field associated with charged wall CW to produce a net nucleation field which exceeds the nucleation threshold of bubble material 20. The charged wall CW will be most intense near the cusp 18, and for this reason the design of conductor 12 and its location with respect to the cusp is generally determined to have the maximum intensity of the field produced by the conductor located at the cusp 18. If this is so, the amount of current $I_n$ required to nucleate a bubble will be minimized.

The strength of the current pulse in conductor 12 is set so that the nucleation threshold of bubble material 12 is exceeded when it is desired to produce a bubble domain B. The pulse width of that current pulse is not critical, and can have a minimum width of 1 microsecond or less, depending upon the rotation frequency of field H. Its width can be extended to dc operation, although such use probably would be impractical due to excessive heating problems. In the usual operation, the current pulse $I_n$ would be applied once each cycle of field H, to provide a nucleator having a frequency consistent with that required for other functions in the bubble system. For device operation at 1MHz using a current pulse having a 0.1 microsecond pulse width, the duty cycle of applied current pulses would be 10%. These and other considerations related to the frequency of operation of bubble domain nucleators are well known in the art.

Figure 2A:
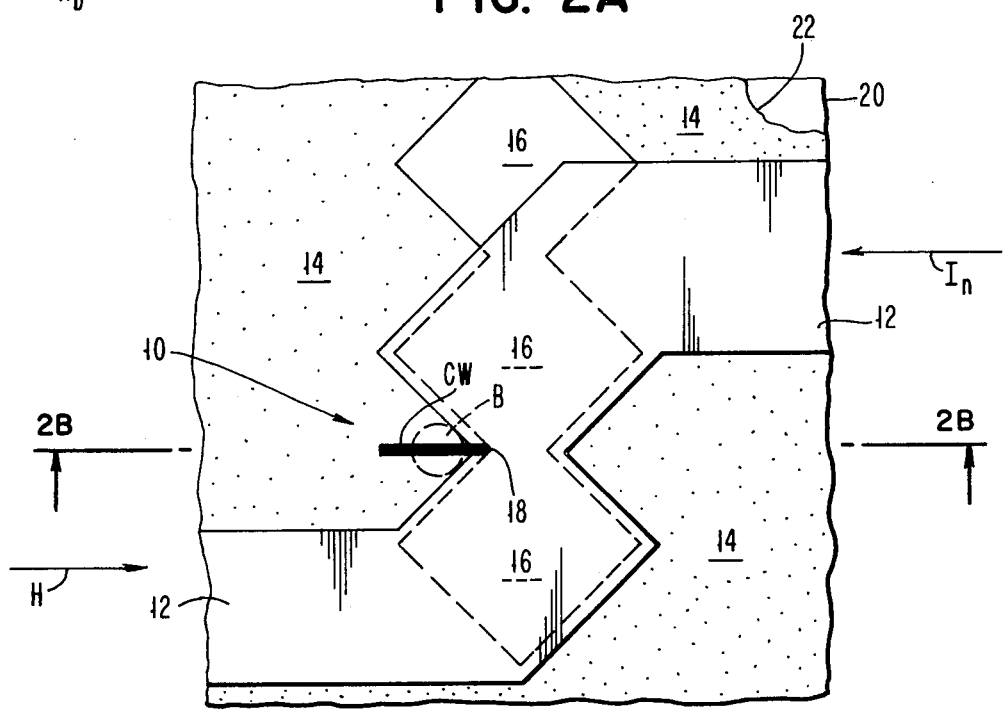
FIG. 2A is a top view of another embodiment of a nucleator according to the present invention.
Figure 2B:
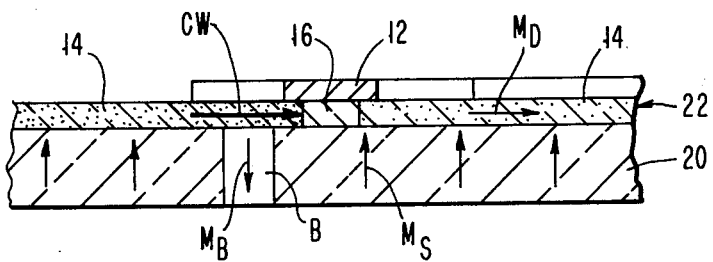
FIG. 2B is a side view of the nucleator of FIG. 2A taken along the line 2B—2B.

FIGS. 2A and 2B are top and side views, respectively, of a bubble nucleator 10 which is similar to that shown in FIGS. 1A and 1B. Accordingly, the same reference numerals will be used whenever possible.

Bubble material 20 has a layer of magnetic material 22 thereover which can be ion implanted to produce regions 14 having in-plane magnetization. Regions 16 of layer 22 are protected by a mask during implantation and are therefore not ion implanted. In a bubble storage device, implanted regions 14 can be used to define contiguous propagation elements which lead to a major loop used to provide magnetic bubble domains to storage loops (minor loops). In such a memory organization, nucleator 10 would be adjacent to the major loop for generating new bubble domains as needed.

Conductor 12 is used to carry nucleation current $I_n$ for producing a magnetic field at cusp 18 which is sufficient to nucleate the bubble domain B. A magnetic charged wall CW extend from cusp 18 when magnetic drive field H has the orientation shown.

FIG. 2B shows a cross-sectional view of the structure of FIG. 2A. As an example, bubble storage layer 20 can be a EuTm magnetic iron garnet while drive layer 22 can be a GdYTm magnetic iron garnet which is readily implantable. Storage layer 20 will support stable magnetic bubble domains of micron and submicron diameters, while drive layer 22 cannot support such stable small bubble domains in the presence of bias field $H_b$. However, layer 22 is readily ion implantable throughout its depth and is used to provide the propagation elements for movement of bubble domains in layer 20. In this manner, a complete magnetic bubble domain storage device can be provided in which the present nucleator is but one component. The advantage of the present nucleator is not only that it operates with reduced levels of nucleation current $I_n$, but also that it is compatible with a bubble storage system using contiguous propagation element where the minimum dimension of elements comprising the various device components is approximately four times the bubble diameter. Accordingly, the width of the conductor 12 is no less than about 4 bubble diameters in the embodiments of FIGS. 1A and 2A, as is apparent from these figures. Since the contiguous propagation elements have to be present to provide other functions in a complete storage system, and since the conductor 12 is a wide conductor that is easily aligned with respect to the underlying propagation elements, the present nucleator can be fabricated with but one masking step.

Comparisons with Other Nucleators (FIGS. 3A–6B) and Table 1

These figures show various bubble domain nucleators, including the present nucleator, which are compared to show the advantages of the present nucleator. Table 1 describes the parameters of the nucleators of FIGS. 3A–6B and illustrates the reduction in nucleation current achieved by use of the present invention nucleator.

Figure 3A:
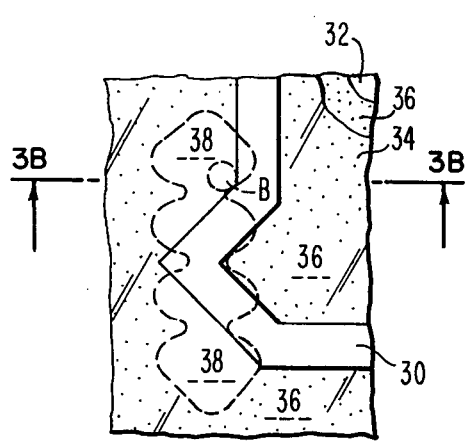

In more detail, the nucleator shown in FIGS. 3A (top view) and 3B (side view) is a conductor nucleator which works on the same principle as that described by T. J. Nelson et al, IEEE Transactions on Magnetics, Vol. 9, p. 289–293 (September 1973). This nucleator produces bubble domains in an unimplanted region of the bubble material without utilizing magnetic charged walls.

The nucleator comprises a current carrying conductor 30 which is located over a magnetic bubble domain material 32 (FIG. 3B) and insulated therefrom by an insulating layer 34. Layer 34 may or may not be necessary as is known in the art. The stippled portions 36 in the top surface of bubble material 32 have been ion implanted. As was indicated in the previous figures, regions 38 of the top surface of layer 32 were masked during the ion implantation step and are therefore not ion implanted. As is apparent, a bubble domain B nucleated in material 32 is not nucleated with the aid of a magnetic charged wall.

Figure 4A:
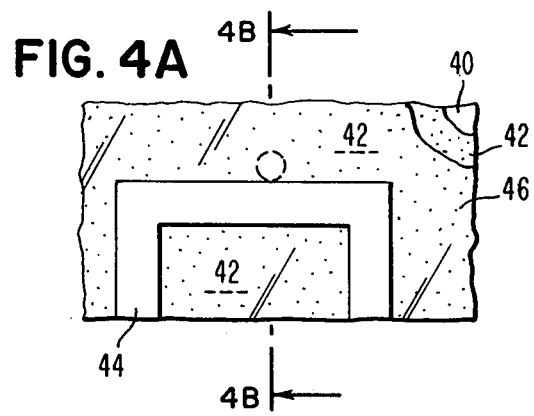
FIG. 4A is a top view of a bubble domain nucleator which does not use magnetic charged walls, and produces bubble domains under an ion-implanted region of the bubble material.
Figure 3B:
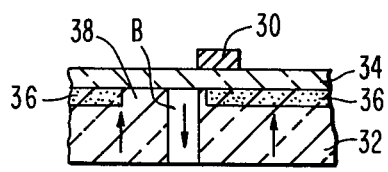
FIG. 3B is a side view of this nucleator taken along the line 3B—3B.
Figure 4B:
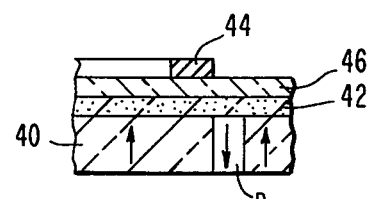
FIG. 4B is a side view of the nucleator of FIG. 4A taken along the line 4B—4B.

The nucleator shown in FIGS. 4A (top view) and 4B (side view) also utilizes only a conductor for bubble nucleation. The difference between this nucleator and that of FIG. 3A is that the bubble is now nucleated under an ion implanted portion of the bubble material. This essentially increases the conductor-bubble spacing.

In more detail, a magnetic bubble domain material 40 has ion implanted regions 42 which are shown as stippled areas. The nucleator comprises a conductor 44 which is spaced from the bubble material 40 by an insulating layer 46. Again, the insulating layer is often unnecessary.

Figure 5A:
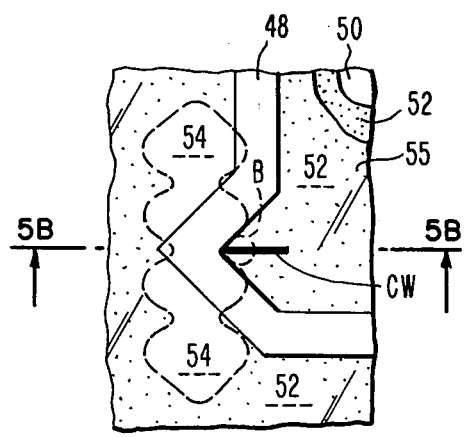
FIG. 5A is a top view of a bubble nucleator which utilizes magnetic charged wall assistance for nucleating bubble domains.

The nucleators of FIGS. 5A, 5B, and 6A, 6B both utilize magnetic charged walls except that they have different variations of conductor arrangement. Because the magnetic field produced by the conductor in the generator of FIG. 5A is at a maximum where the charged wall is most intense, the generator of FIG. 5A is more efficient than that of FIG. 6A, although both are more efficient than those shown in FIGS. 3A and 4A.

In FIG. 5A, the nucleator comprises a current carrying conductor 48 which is used to nucleate bubble B at the left-hand end of the charged wall CW. The bubble is nucleated in magnetic material 50, beneath the ion implanted portion 52 (shown as a stippled region) thereof. As in previous embodiments, regions 54 are masked during the ion implantation of layer 50 so that the top surface of layer 50 is not ion implanted in regions 54. Insulating layer 55 (FIG. 5B) is again provided.

Figure 6A:
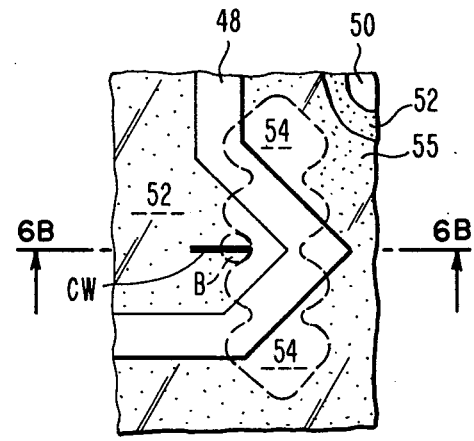
FIG. 6A is a top view of a bubble nucleator which also uses magnetic charged wall assistance. The conductor arrangement (in FIG. 6A) is different than that shown in the nucleator of FIG. 5A.
Figure 5B:
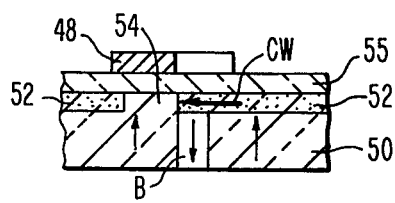
FIG. 5B is a side view of the nucleator of FIG. 5A, taken along the line 5B—5B.
Figure 6B:
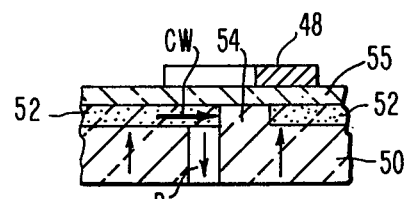

In the embodiment of FIGS. 6A and 6B, the basic structure is the same as that in FIGS. 5A and 5B. The only difference is the location of the conductor, and for this reason the same reference numerals will be used as were used in FIG. 5A. Thus, the magnetic field produced by current in conductor 48 at the right-hand most portion of charged wall CW is not as intense as it is in the embodiment of FIG 5A. Therefore, even though bubble nucleation is assisted by the charged wall, the efficiency of the generator of FIG. 6A is less than that of FIG. 5A.

The following Table 1 describes the various properties of each of the nucleators shown in FIGS. 3A, 4A, 5A, and 6A.

Table 1

|  | 5-μm BUBBLE, 20-μm LINE | | | | 1-μm BUBBLE, 5.5-μm LINE | | | |
| --- | --- | --- | --- | --- | --- | --- | --- | --- |
|  | FIG. 3A | FIG. 4A | FIG. 5A | FIG. 6A | FIG. 3A | FIG. 4A | FIG. 5A | FIG. 6A |
| $I_n$(mA) | 700 | 900 | 150 | 240 | 1100 | 1400 | 700 | 800 |
| S/W | 0.018 | 0.06 | 0.06 | 0.06 | 0.16 | 0.21 | 0.21 | 0.21 |
| $(H_i)_{max}$ | 372 | 300 | 420 | 170 | 660 | 350 | 770 | 462 |
| $H_i$(Oe) | 260 | 270 | 63 | 40 | 726 | 770 | 540 | 370 |
| $H_\perp$(Oe) | 90 | 90 | 90 | 90 | 370 | 370 | 370 | 370 |
| $H_i - H_\perp$ | 170 | 180 | −27 | −50 | 356 | 400 | 170 | 0 |
| $H_{cw}$(Oe) | 0 | 0 | 207 | 230 | 0 | 0 | 230 | 400 |
| $H_K - 4\pi M$ | 560 | 560 | 560 | 560 | 1300 | 1300 | 1300 | 1300 |
| $H_{cw}/H_i$ | 0/260 | 0/270 | 207/63 | 230/40 | 0/726 | 0/770 | 230/540 | 400/370 |

LEGEND:
$I_n$ = minimum current for nucleating bubbles. The current pulse width was 0.1 microsecond.
S = conductor to bubble surface spacing
W = conductor width
$(H_i)_{max}$ = z-component field produced by conductor carrying 1-A current
$H_i$ = actual z-component field produced by conductor during nucleation $H_i = I \times (H_i)_{max}$
$H_\perp$ = external bias field ($H_b$ in FIG. 1A)
$H_{cw}$ = estimated z-component field produced by a charged wall (assuming $H_{cw} + H_i$ in nucleators of FIGS. 5A & 6A equal to $H_i$ in nucleator of FIG. 4A)
$H_K - 4\pi M$ = estimated effective anisotropy field in storage layer As is apparent from the foregoing table, the nucleators shown in FIGS. 5A and 6A are more efficient than the other nucleators which do not use charged wall assistance for bubble nucleation. For the case of a 5 micron bubble, the nucleation current is reduced from 700 mA in the nucleator of FIG. 3A to 150 mA in the nucleator of FIG. 5A. This indicates that the charged wall/current contribution ratio ($H_{cw}/H_i$) is around 3/1.

In other words, the efficiency of the charged wall in contributing to nucleation is close to 100% (which is equal to $4\pi M$ of the implanted region).

In the case of 1 micron bubbles, the reduction in current level attributable to the charged wall is not as great as is the situation for 5 micron bubbles, but still is appreciable. For example, nucleation currents are reduced from 1100 mA for the nucleator of FIG. 3A to 700 mA for the nucleator of FIG. 5A. The efficiency of the charged wall in contributing to nucleation here is approximately 40% (i.e., 40% of $4\pi M$). The efficiency field intensity and the profile of the field due to current in the conductor.

NUCLEATION OF 1 MICRON BUBBLES IN DOUBLE GARNET STRUCTURES

The following table shows the nucleation of magnetic bubble domains in double garnet structures with and without charged wall assistance. The nucleator which utilizes charged wall assistance is that shown in either FIG. 1A or FIG. 2A. The LEGEND located below the table explains the symbols used in the table.

Table 2

| | NUCLEATION OF 1-μm BUBBLES IN DOUBLE-GARNET LAYERS | | | | | | | | | |
|---|---|---|---|---|---|---|---|---|---|---|
| SAMPLE | $4\pi M_D/4\pi M_B$ (G) | $Q_B$ | WXT (μm) | NUCLEATOR TYPE | Z (μm) | Z/W | η | $I_n$ (Amp) | $H_z$ (Oe) | $H_z/4\pi M_B$ |
| 1 | 575/586 | 2 | 4.5×1 | X | 0.5 | 0.11 | 0.7 | 0.45 | 420 | 0.72 |
|  |  |  |  | 0 | 0.97 | 0.22 | 0.5 | 0.2 | 132 | 0.23 |
| 2 | 595/800 | 2.5 | 9×0.6 | X | 0.4 | 0.044 | 0.99 | 0.95 | 634 | 0.79 |
|  |  |  |  | 0 | 0.72 | 0.08 | 0.8 | 0.55 | 295 | 0.37 |
| 3 | 585/750 | 2.8 | 4.5×0.6 | X | 0.65 | 0.14 | 0.62 | 0.95 | 784 | 1.05 |
|  |  |  |  | 0 | 1.06 | 0.24 | 0.47 | 0.6 | 375 | 0.5 |
| 4 | 585/771 | 2.9 | 4.5×1 | X | 0.9 | 0.2 | 0.52 | 1.1 | 762 | 0.99 |
|  |  |  |  | 0 | 1.2 | 0.27 | 0.43 | 0.7 | 401 | 0.52 |
| 5 | 550/771 | 3.2 | 5×1 | X | 0.5 | 0.1 | 0.7 |  |  |  |
|  |  |  |  | 0 | 0.91 | 0.18 | 0.52 | 0.8 | 500 | 0.65 |

LEGEND
$4\pi M_D/4\pi M_B$ = driving layer/bubble storage layer magnetization ratio
$Q_B$ = quality factor of bubble domain storage layer
WXT = conductor cross section
X = nucleator operating without charged wall assistance
0 = nucleator operating with charged wall assistance
Z = spacing between the mid-plane of the conductor and the bubble surface
Z/W = spacing-to-linewidth ratio of the conductor
I = current in conductor
$I_n$ = minimum nucleation current. The current pulse width was 0.1 microsecond.
$H_z$ = z-component of the magnetic field produced by current I in the conductor
$H_z/4\pi M_B$ = normalized z-component of the magnetic field produced by the conductor
$\eta$ = conductor's driving efficiency = $\dfrac{H_z}{I/2W}$ can be improved with an appropriate conductor arrangement which avoids overlapping between the cusp of the implanted regions and the edge of the nucleating conductor, which tends to dilute the charged wall intensity.

In the practice of this invention, short nucleating current pulses of about 0.1 microsecond were used. If the current pulse is very long, a nucleated bubble may strip-out and reappear at a location other than where it was nucleated. While this does not affect the basic nucleation process, it is a factor to be considered in the design of a total bubble system.

A further reduction in the amount of current required to nucleate 1 micron bubble domains can be readily achieved by various techniques. For example, the reduction of the quality factor Q of the bubble domain storage layer will decrease the required nucleating current, since nucleation is more readily obtained in bubble materials of lower Q. As an example, if the Q of the bubble layer is reduced to 2 from a value of 2.5–3, nucleation current will reduce by a factor of 2–3.

Another way to reduce nucleation currents is to improve the conductor layout so that the horizontal component of the field produced by current in the conductor will not dilute the charged wall intensity. To provide the most efficient nucleator, the maximum vertical component of the field produced by current in the conductor should be at the end of the charged wall which is most intense (i.e., the end closest to the cusp 18 — FIG. 1A).

Another technique for reducing nucleation currents is to lower the conductor so that it is closer to the bubble storage medium. This reduces the ratio S/W described in Table 1, which in turn enhances the magnetic What has been described is an improved bubble domain nucleator using magnetic wall assistance which is particularly suitable in bubble device systems which make primary use of magnetic charged walls. A particular example is a contiguous element bubble storage device where the mechanism of magnetic charged walls is used for propagation of bubbles and for other functions in the device. The present invention recognizes that the magnetic charged wall can be used for assisting bubble domain nucleation in a compatible structure which has minimum complexity and fabrication difficulties. Thus, the possibility of a complete bubble domain storage device using magnetic charged walls in all components of the device now appears possible. Further, the nucleator requires no additional structural components, since the charged walls have to be produced at any rate for bubble domain propagation.

The present invention is also particularly useful in those devices where magnetically soft overlayers should not be used in portions of the magnetic chip. For instance, ion implanted regions of a magnetic medium may be the primary components for bubble propagation. Rather than use a localized magnetically soft element for assistance of the nucleation operation, the present invention provides efficient nucleation without requiring the addition of such an element. Still further, if a magnetically soft layer is used, it will be a continuous layer having apertures therein in order to be able to support magnetic charged walls. This is quite different than providing discrete magnetic elements of narrow linewidth which have to be critically positioned with respect to the rest of the bubble propagation elements. Consequently, the present nucleator has additional advantages relating to the ease with which it can be fabricated.

In its broadest aspect, the present invention teaches the combination of an externally applied magnetic field in combination with the magnetic field associated with a magnetic wall, such as a charged wall, Neel wall, or a Bloch wall, for nucleating magnetic bubble domains in a magnetic bubble medium. Of course, the charged wall is preferred since its stray field is most intense and concentrated, and since it is a naturally occurring phenomenon of the ion-implanted contiguous element propagation structure. Usually the structure for providing the external magnetic field is a current carrying conductor. However, it is possible to use another means for providing this external magnetic field, such as the magnetic field of a bubble which is brought close to the charged wall at the proper time to assist in nucleation.

Based on the principles described herein, those of skill in the art will be able to devise alternatives to the nucleation structures disclosed, which are consistent with and in accordance with the principles described.

What is claimed is:

1. A magnetic bubble domain nucleator for nucleating magnetic bubble domains in a magnetic medium, comprising:
   means including a magnetic layer for producing a magnetic charged wall therein when a magnetic field is present in said magnetic layer, said charged wall having a first magnetic field associated therewith directed anti-parallel to the direction of magnetization of said magnetic medium,
   magnetic means for producing a second magnetic field directed parallel to said first magnetic field,
   where the combination of said first and second magnetic fields is of sufficient intensity to nucleate a bubble domain in said magnetic medium.

2. The nucleator of claim 1, where said magnetic means is a current carrying conductor.

3. The nucleator of claim 2, where said conductor is located with respect to said charged wall that the magnetic field produced by current in said conductor is a maximum in the region where said first magnetic field is a maximum.

4. The nucleator of claim 1, where said bubble domain is nucleated in the vicinity of said magnetic charged wall.

5. The nucleator of claim 1, where said first magnetic field is greater than said second magnetic field.

6. The nucleator of claim 1, where said first magnetic field is less than said second magnetic field.

7. The nucleator of claim 1, where said means for producing said magnetic charged wall is comprised of contiguous propagation elements along which magnetic charged walls move in response to the reorientation of an applied magnetic field, said contiguous propagation elements being comprised of ion implanted regions forming a shift register for movement of said bubble domains.

8. The nucleator of claim 1, where said means for producing said magnetic charged wall is comprised of contiguous propagation elements along which magnetic charged walls move in response to the reorientation of an applied magnetic field, said propagation elements being formed in a continuous sheet of magnetically soft material and providing a shift register for movement of said magnetic bubble domains.

9. A method for nucleating magnetic bubble domains in a magnetic medium, said method comprising the stpes of:
   applying a first magnetic field from a magnetic charged wall produced in a magnetic layer having in-plane magnetization to a localized region of said magnetic medium, the magnitude of this first magnetic field being insufficient to induce a reversal of the direction of the magnetization in the magnetic medium, and
   applying a second magnetic field to said localized region of said magnetic medium, the combined magnitude of said first and second magnetic fields being sufficiently large to induce a reversal of the direction of magnetization of the magnetic medium in said localized region to thereby nucleate a bubble domain.

10. The method of claim 9, where said second magnetic field is provided by current flow through a conductor.

11. The method of claim 10, wherein said current is applied as a current pulse in said conductor during selected cycles of rotation of an external magnetic field in the plane of said magnetic medium.

12. The method of claim 10, where said magnetic charged wall is produced in a magnetic layer located adjacent to said magnetic medium in which said bubble domain is nucleated.

13. A device for nucleating a magnetic bubble domain in a localized region of a magnetic medium, comprising:
   a shift register for movement of magnetic bubble domains in said magnetic medium, said shift register being comprised of contiguous propagation elements along which magnetic charged walls move in response to the reorientation of a magnetic field in the plane of said contiguous propagation elements,
   a current carrying conductor overlaying said magnetic medium and positioned so that a portion of said conductor is located near said localized region of said magnetic medium, for providing a magnetic field in said localized region of said magnetic medium when a current is pulsed through said conductor,
   said magnetic charged walls having magnetic fields associated therewith, the combined magnitude of said charged wall magnetic field and the magnetic field produced by current in said conductor being sufficient to nucleate a bubble domain in said localized region of said magnetic medium, both the magnitude of said magnetic field produced by current in said conductor and the magnitude of said charged wall magnetic field being insufficient alone to nucleate said bubble domain in said localized region.

14. The device of claim 13, where said contiguous propagation elements have a cusp region located adjacent to said localized portion of said magnetic medium, said current carrying conductor being located so that its magnetic field will be a maximum in the vicinity of said cusp-like region for nucleating a magnetic domain in said localized region of said magnetic medium.

15. The device of claim 13, where said contiguous propagation elements have curved edges.

16. The device of claim 17, where said contiguous propagation elements have diamond-like shapes.

17. The nucleator of claim 13, where said conductor has a width several times the diameter of said bubble domains.

18. A method for nucleating magnetic bubble domains in a magnetic medium, comprising the steps of:
   applying a first magnetic field from a magnetic wall located in a magnetic layer to a localized region of said magnetic medium, the magnitude of this first magnetic field being insufficient to induce a reversal of the direction of the magnetization in the magnetic medium, and
   applying a second magnetic field to said localized region of said magnetic medium by passing a current through a conductor, the combined magnitude of said first and second fields being sufficiently large to induce a reversal of the direction of magnetization of the magnetic medium in said localized region to thereby nucleate a bubble domain.

19. The method of claim 18, where said magnetic wall is produced in a magnetic material whose magnetization lies in the plane of said material.

20. A magnetic bubble domain nucleator for nucleating magnetic bubble domains in a magnetic medium, comprising:
   means for producing a magnetic charged wall having a first magnetic field associated therewith directed anti-parallel to the direction of magnetization of said magnetic medium, where said means for producing said magnetic charged wall is an ion implanted region in which said magnetic charged wall is produced by a magnetic field in the plane of said ion implanted region,
   magnetic means for producing a second magnetic field directed parallel to said first magnetic field,
   where the combination of said first and second magnetic fields is of sufficient intensity to nucleate a bubble domain in said magnetic medium.

21. A magnetic bubble domain nucleator for nucleating magnetic bubble domains in a magnetic medium, comprising:
   means for producing a magnetic charged wall having a first magnetic field associated therewith directed anti-parallel to the direction of magnetization of said magnetic medium, where said means for producing said magnetic charged wall includes a continuous layer of magnetically soft material having at least one aperture therein and means for producing a magnetic field in said magnetically soft material,
   magnetic means for producing a second magnetic field directed parallel to said first magnetic field,
   where the combination of said first and second magnetic fields is of sufficient intensity to nucleate a bubble domain in said magnetic medium.

22. A method for nucleating magnetic bubble domains in a magnetic medium, said method comprising the steps of:
   applying a first magnetic field from a magnetic charged wall to a localized region of said magnetic medium, the magnitude of this first magnetic field being insufficient to induce a reversal of the direction of the magnetization in the magnetic medium, wherein said magnetic charged wall is produced by applying an external magnetic field to an ion implanted region of magnetic material, and
   applying a second magnetic field by current flow through a conductor to said localized region of said magnetic medium, the combined magnitude of said first and second magnetic fields being sufficiently large to induce a reversal of the direction of the magnetization of the magnetic medium in said localized region to thereby nucleate a bubble domain.

23. A method for nucleating magnetic bubble domains in a magnetic medium, said method comprising the steps of:
   applying a first magnetic field from a magnetic charged wall to a localized region of said magnetic medium, the magnitude of this first magnetic field being insufficient to induce a reversal of the direction of the magnetization in the magnetic medium, where said first magnetic field is produced by applying an external magnetic field to a continuous layer of magnetically permeable material having magnetic discontinuities therein, and
   applying a second magnetic field by current flow through a conductor to said localized region of said magnetic medium, the combined magnitude of said first and second magnetic fields being sufficiently large to induce a reversal of the direction of magnetization of the magnetic medium in said localized region to thereby nucleate a bubble domain.

* * * * *